US007928800B2

(12) United States Patent
Ballarin et al.

(10) Patent No.: US 7,928,800 B2
(45) Date of Patent: Apr. 19, 2011

(54) PROGRAMMABLE COMPENSATION NETWORK FOR OPERATIONAL AMPLIFIERS

(75) Inventors: Fabio Ballarin, Villach (AT); Alfonso D'Andretta, Padua (IT); Martin Clara, Villach (AT); Antonio Di Giandomenico, Velden am Worthersee (AT); Dario Giotta, Tarvisio (IT); Andreas Wiesbauer, Portschach (AT)

(73) Assignee: Infineon Technologies AG, Neubiberg (DE)

( * ) Notice: Subject to any disclaimer, the term of this patent is extended or adjusted under 35 U.S.C. 154(b) by 54 days.

(21) Appl. No.: 12/327,739

(22) Filed: Dec. 3, 2008

(65) Prior Publication Data
US 2010/0134190 A1 Jun. 3, 2010

(51) Int. Cl.
*H03F 1/36* (2006.01)
(52) U.S. Cl. .................................. 330/107; 330/151
(58) Field of Classification Search .......... 330/107, 330/109
See application file for complete search history.

(56) References Cited

U.S. PATENT DOCUMENTS

| | | | | |
|---|---|---|---|---|
| 6,002,299 A * | 12/1999 | Thomsen | | 330/9 |
| 6,535,061 B2 * | 3/2003 | Darmawaskita et al. | | 330/254 |
| 6,985,038 B2 * | 1/2006 | Miwa et al. | | 330/258 |
| 7,199,656 B1 * | 4/2007 | Aram et al. | | 330/124 R |

OTHER PUBLICATIONS

Mitteregger et al, "A 20mW 640MHz CMOS Continuous-Time SD ADC with 20MHz Signal Bandwidth, 80dB Dynamic Range and 12bit ENOB", IEEE Journal of Solid-State Circuits, vol. 41., No. 12, Dec. 2006, pp. 2641-2649.
Thandri et al, "A Robust Feedforward Compensation Scheme for Multistage Operational Transconductance Amplifiers With no Miller Capacitors", IEEE Journal of Solid-State Circuits, vol. 38, No. 2, Feb. 2003, pp. 237-243.

* cited by examiner

*Primary Examiner* — Steven J Mottola
(74) *Attorney, Agent, or Firm* — Lee & Hayes, PLLC

(57) ABSTRACT

Systems and methods for implementing a programmable network for a multimode conditionally stable operational amplifier are disclosed.

18 Claims, 7 Drawing Sheets

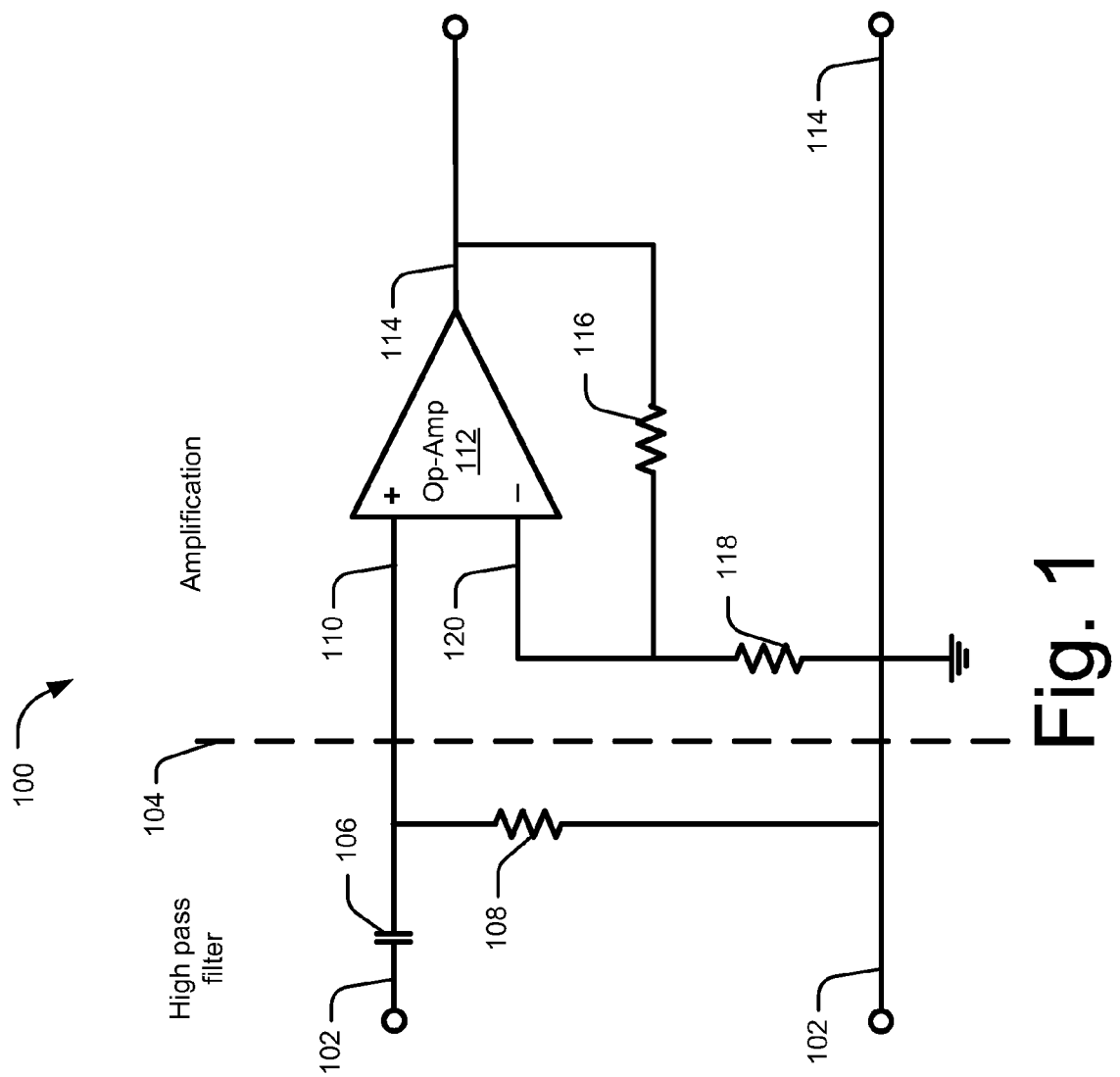

US 7,928,800 B2

PROGRAMMABLE COMPENSATION NETWORK FOR OPERATIONAL AMPLIFIERS

BACKGROUND

Typically, an operational amplifier employs a variety of compensation networks to control various parameters such as gain margin, phase margin, and so forth, to maintain stability. Compensation networks may be based on various compensation schemes, such as feedback compensation scheme, feedforward compensation scheme, etc. A compensation network may also be employed in a conditionally stable operational amplifier.

A conditionally stable operational amplifier may be used in a variety of electronic or communication systems, for example in a gain stage; however, conditionally stable operational amplifiers may be stable only in specific gain configurations. The execution of different gain configurations may require a corresponding change in the configuration of the compensation circuit of the conditionally stable operational amplifier. Therefore, a standard conditionally stable operational amplifier may not operate in multiple modes of operation, and its performance may not be uniform over different gain configurations.

Furthermore, the conditionally stable operational amplifier working in a given closed loop configuration may be stable only for a particular condition, such as gain, unity-gain-frequency, etc. This may be a limitation when the conditionally stable operational amplifier is used in a multi mode system. For example, if the conditionally stable operational amplifier is stable at a specified gain, then at a higher gain configuration, stability may not be guaranteed. Therefore, the programmability of the compensation circuit of the conditionally stable operational amplifier may become of a great importance.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 1 is a block diagram illustrating an exemplary system (single ended) implementing a high-pass filter noninverting configuration using a conditionally stable operational amplifier.

DETAILED DESCRIPTION

Figure 2A:
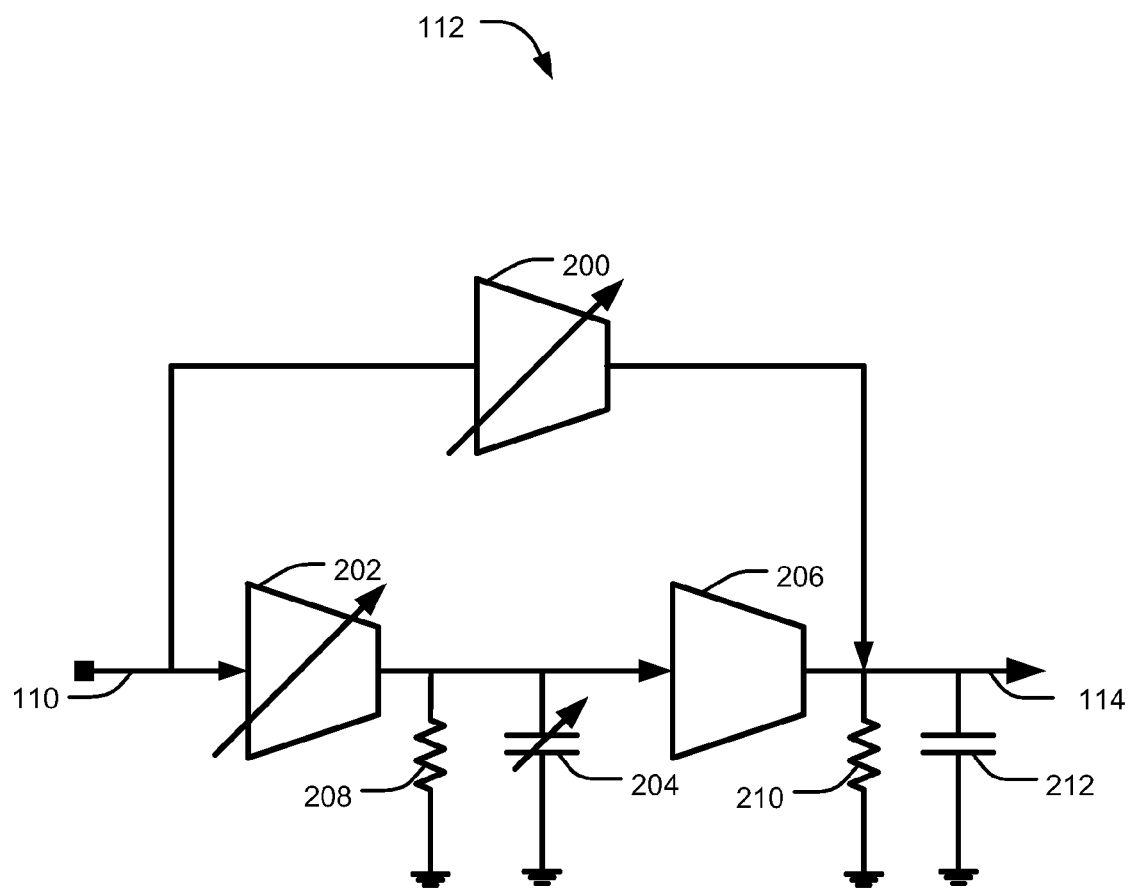
FIG. 2A is a block diagram illustrating an exemplary programmable compensation network in a conditionally stable operational amplifier.

The disclosed subject matter relates to a programmable compensation network for a conditionally stable operational amplifier. More particularly, the subject matter relates to techniques for stabilizing a multimode conditionally stable operational amplifier across varying conditions. The programmable compensation network for a conditionally stable operational amplifier can be implemented in a variety of electronic or communication devices that require a stable output in different conditions. Devices that can benefit from the circuit(s) disclosed include, but are not limited to, programmable filters employed in a variety of applications such as radio systems, mobile phones, etc. The following systems and methods are described with reference to a programmable filter; however, it will be appreciated that the disclosed techniques and circuits can be implemented generally in any similar electronic/communication system.

Exemplary System

FIG. 1 illustrates an exemplary system 100 implementing a high pass filter noninverting configuration of a conditionally stable operational amplifier. An input voltage 102 is filtered by a passive high pass filter located at the left side of line 104, and amplified at right side of line 104.

The high pass filter is a filter that allows high frequency components of voltage 102 to pass, and provides a capacitor component 106 and a resistor component 108. The capacitor component 106 attenuates a low frequency component of the input voltage 102, while allowing the high frequency components of input voltage 102 to pass. A relatively high capacitor reactance in the capacitor component 106 is present in the low frequency component of the input voltage 102, while the capacitor component 106 acts as a short circuit at the high frequency component of input voltage 102. The resistor component 108 provides a biasing voltage when the capacitor component 106 acts as a short circuit at the high frequency component of the input voltage 102. The biasing voltage may pass through path 110 and is received by a noninverting node of a conditionally stable operational amplifier component 112.

The conditionally stable operational amplifier component 112 amplifies the high frequency component of the input voltage 102 and uses a negative feedback for compensation purposes. The output of the conditionally stable operational amplifier component 112 in path 114 includes an amplified high frequency component of the input voltage 102 which is used as the negative feedback to create stability in the conditionally stable operational amplifier component 112.

A resistor component 116 and a resistor component 118 may provide a passband gain for the high pass filter noninverting configuration using a conditionally stable operational amplifier 112. The resistor component 116 and the resistor component 118 produces a negative feedback signal that is carried by path 120, and received by an inverting input node of the conditionally stable operational amplifier component 112. In an implementation, the conditionally stable operational amplifier component 112 may include an internal programmable compensation network in order to maintain stability towards various gain ranges as may be required by a functionality of the conditionally stable operational amplifier component 112 application.

FIG. 2 illustrates an exemplary architecture of the conditionally stable operational amplifier component 112 that operates as a programmable compensation network. The programmable compensation network architecture (i.e., operational amplifier component 112) is intended to explain a concept and operation of the conditionally stable operational amplifier component 112 at an elementary level, and the number and type of electronic components depicted in the circuit diagram is not intended to limit the programmable compensation network. Furthermore, although a two stage amplifier is described in this example, it is to be appreciated that programmable conditional stability may be applied to "N" stage amplifiers.

The operational amplifier component 112 includes electronic components, such as transistors, current sources, resistors, voltage supply, etc. In an implementation, the operational amplifier component 112 (e.g., two stage conditionally stable operational amplifier with programmable compensation network) includes a feed-forward compensation scheme which may be realized with the use of a programmable operational trans-conductance amplifier component (OTA) 200. The programmable OTA component 200 may be adjusted to produce various output signals to attain a desired frequency of unity open loop gain and phase margin, corresponding to a particular application functionality. The programmable operational amplifier component 112 may be implemented at the same time with a programmable OTA component 202 and programmable capacitor component 204. The programmable OTA component 202 is the first stage of the operational amplifier component 112 and may be adjusted to set the desired frequency of unity open loop gain and phase margin in the conditionally stable operational amplifier component 112.

Figure 2B:
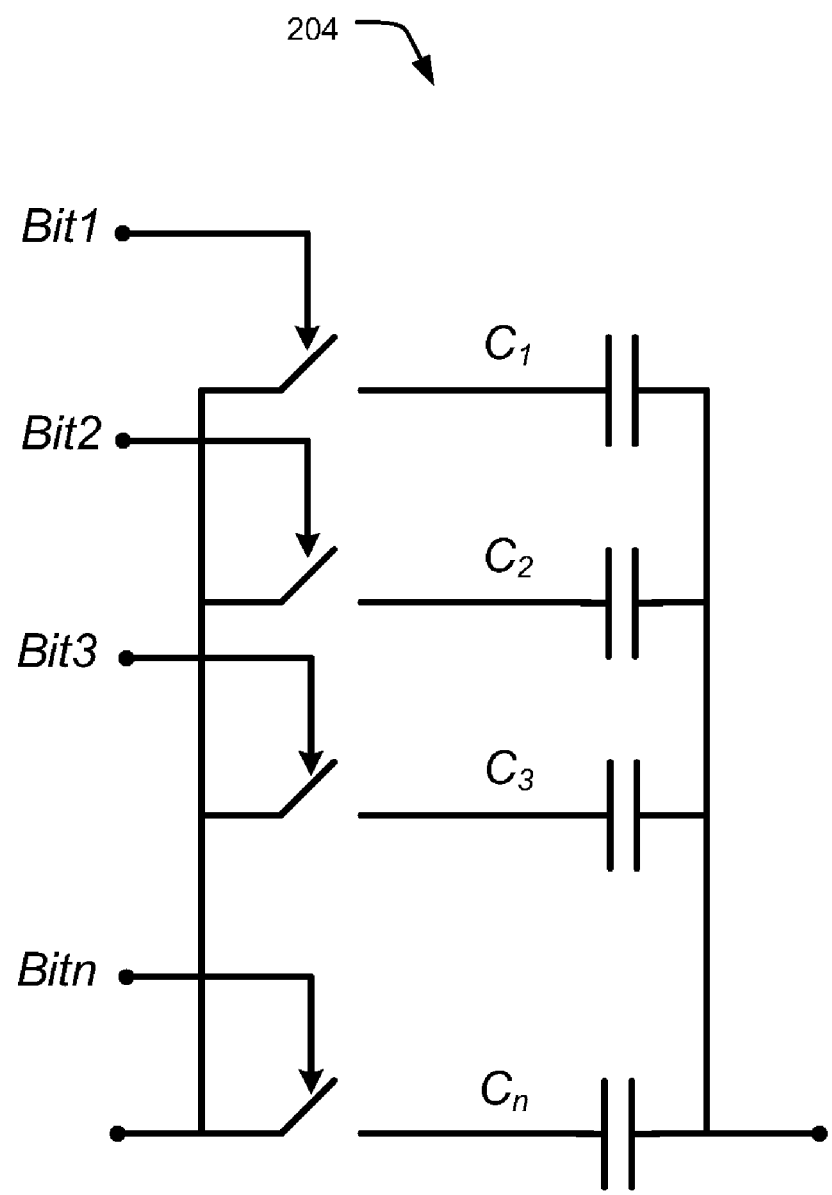
FIG. 2B is a block diagram illustrating an exemplary programmable capacitor component.

The programmable capacitor component 204 connected at an output node of the programmable OTA component 202 is used as a parameter to program the operational amplifier component 112. To this end, the three programmable components (e.g., OTA component 200, OTA component 202 and capacitor component 204) are all adjusted to produce the compensating network for the operational amplifier component 112 to attain stability in various closed loop applications. Referring now to FIG. 2B, illustrated is an example of a programmable capacitor component 204.

Referring back to FIG. 2A, an OTA component 206 provides a second stage for the operational amplifier component 112. The operational amplifier component 112 may include additional stages, to achieve a higher amplifier open loop gain, depending on the application. A resistor 208 represents an output resistance of the first stage while a resistor 210 represents an output resistance in the output of the second stage of the operational amplifier component 212. A capacitor 212 may also represent a load capacitance that is generated by the operational amplifier component 112.

Figure 3:
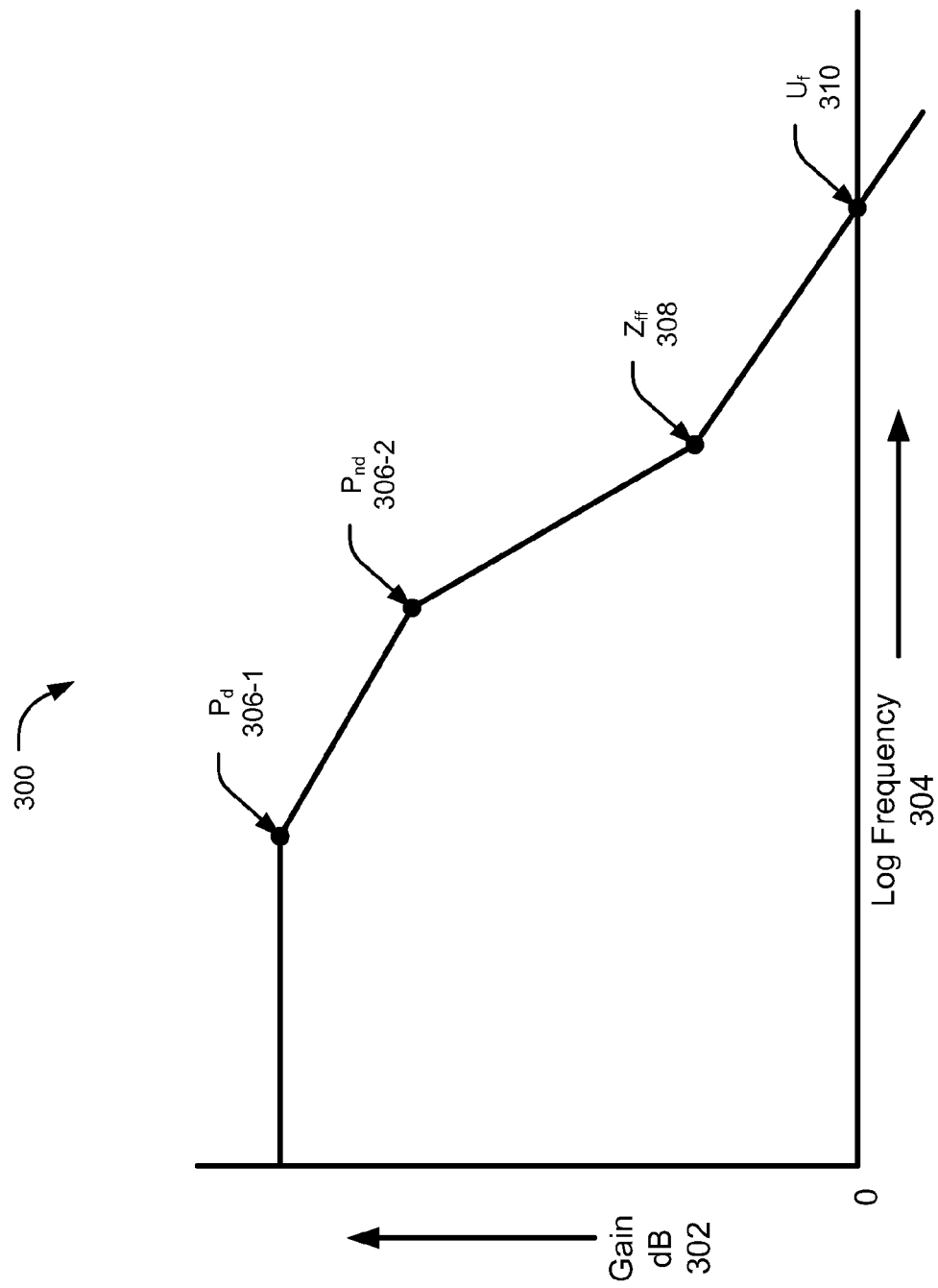
FIG. 3 is a chart illustrating a Bode plot between gain and frequency of an exemplary open-loop transfer function of a programmable conditionally stable operational amplifier.

FIG. 3 illustrates an exemplary Bode plot 300 between gain and frequency of an open-loop transfer function of the operational amplifier component 112. The gain 302, in decibels (db), of the operational amplifier component 112 is shown along the Y axis while the log frequency 304 is shown along the X axis. The Bode plot 300 shows the location of dominant poles and dominant zeroes of the open-loop transfer function of the operational amplifier component 112. The dominant poles are represented by $P_d$ 306-1 and $P_{nd}$ 306-2. The dominant zero is represented by $Z_{ff}$ 308. An open-loop unity gain frequency that corresponds to a gain of 0 dB is represented by $U_f$ 310. At the open-loop unity gain frequency, the Bode plot 300 crosses the X axis. The plot 300 represents a stable operating condition of the operational amplifier component 112.

The operational amplifier component 112 may be stable for specific conditions (i.e., conditionally stable), and act as a conditionally stable operational amplifier. For example, the conditionally stable operational amplifier (i.e., operational amplifier component 112) can be stable for a specific closed loop gain. In other words, the conditionally stable operational amplifier (i.e., operational amplifier component 112) may not be stable for all gains. The stability of the operational amplifier component 112 at the unity gain frequency $U_f$ 310 is provided by a −20 dB/decade slope at the 0 dB crossing on the Bode plot 300.

For the operational amplifier component 112 to be stable, under different set conditions such as gain, zeros of the open-loop transfer function should be in the left-half-plane (LHP). For example, an operational amplifier is stable if the frequency of zeros is less than its unity gain frequency. Further, the location of zero $Z_{ff}$ 308 in the bode plot 300 determines the phase margin of the operational amplifier.

In a cascaded amplifier, such as operational amplifier component 112, each gain stage introduces a pole in the open loop transfer function. In an implementation, the gain stages are represented by OTAs in the first and the second gain stage. The poles produce a negative phase shift and impede the overall phase margin; however, the phase margin benefits from the left-half-plane (LHP) zero.

The operational amplifier component 112, in an implementation, assures that the feed-forward path, that includes the programmable OTA component 200, creates LHP zeroes to compensate the negative phase shift produced due to low frequency poles through a positive phase shift of the LHP zeros. Therefore, a higher open loop unity gain bandwidth can be achieved.

The operational amplifier component 112 may be stable for a particular gain and a corresponding frequency. When closed loop gain of the operational amplifier component 112 may be varied and set to a desired value, the stability of the system may be disturbed. Therefore, the location of zero $Z_{ff}$ 308 would be modified for the initial frequency. This initial frequency may not be able to produce the required phase shift to compensate for the negative phase shift generated by the poles of the open-loop transfer function. Phase margin of the operational amplifier component 112 may be altered, affecting the stability of the operational amplifier component 112. Therefore, the corresponding frequency of zero $Z_{ff}$ may be adjusted depending upon the set gain to maintain stability of the operational amplifier component 112. That frequency may be adjusted such that it is lower than the unity gain frequency $U_f$ 310.

In an implementation, the location of zero $Z_{ff}$ 308 of the open-loop transfer function, corresponding to the frequency that keeps the operational amplifier component 112 stable, may be adjusted based upon certain parameters. The parameters include trans-conductance of the programmable OTA component 202 in the first stage, trans-conductance of the programmable OTA component 200 in the feed-forward stage, and capacitance of the programmable capacitor component 204. The proportionality of the location of zeroes to these parameters may be represented in the following manner:

$$Z_{ff} \alpha (gm_1 * gm_2)/(gm_{ff} * C1) \tag{1}$$

Equation (1) represents that the location of zero $Z_{ff}$ 308 is proportional to the ratio of the product of trans-conductance $gm_1$ of the programmable OTA component 202 in the first stage and trans-conductance $gm_2$ of the OTA component 206 in the second stage, and the product of trans-conductance $gm_{ff}$ of the programmable OTA component 200 in the feed-forward stage and the capacitance C1 of the programmable capacitor component 204.

Therefore, depending upon the desired value of the open loop unity gain bandwidth and the respective phase margin required at that frequency: trans-conductance $gm_1$ is set on the first stage through the programmable OTA component 202; trans-conductance $gm_{ff}$ of the feed-forward stage is programmed by using the programmable OTA component 200;

the capacitance C1 is programmed by using the programmable capacitor component 204. In an implementation, the programmability of the programmable trans-conductance of the programmable OTA components 200 and 202 may be made by a bank of switchable pMOS transistors connected in parallel. The programmability of the programmable capacitor component 204 may be made by a bank of switchable capacitors. Those programming parameters allow the operational amplifier component 112 to be operable for multiple conditions and various gain ranges.

The ability of the operational amplifier component 112 to be stable for multiple conditions and various gain ranges allows such operational amplifier component 112 to be operated in different operative modes such as unity gain buffer, high bandwidth integrator, low power integrator, and so on. The programmability of the above mentioned quantities, described in equation (1), may allow a fine adjusting of the required open loop unity gain bandwidth and phase margin for each particular operative mode of the intended application.

Figure 4A:
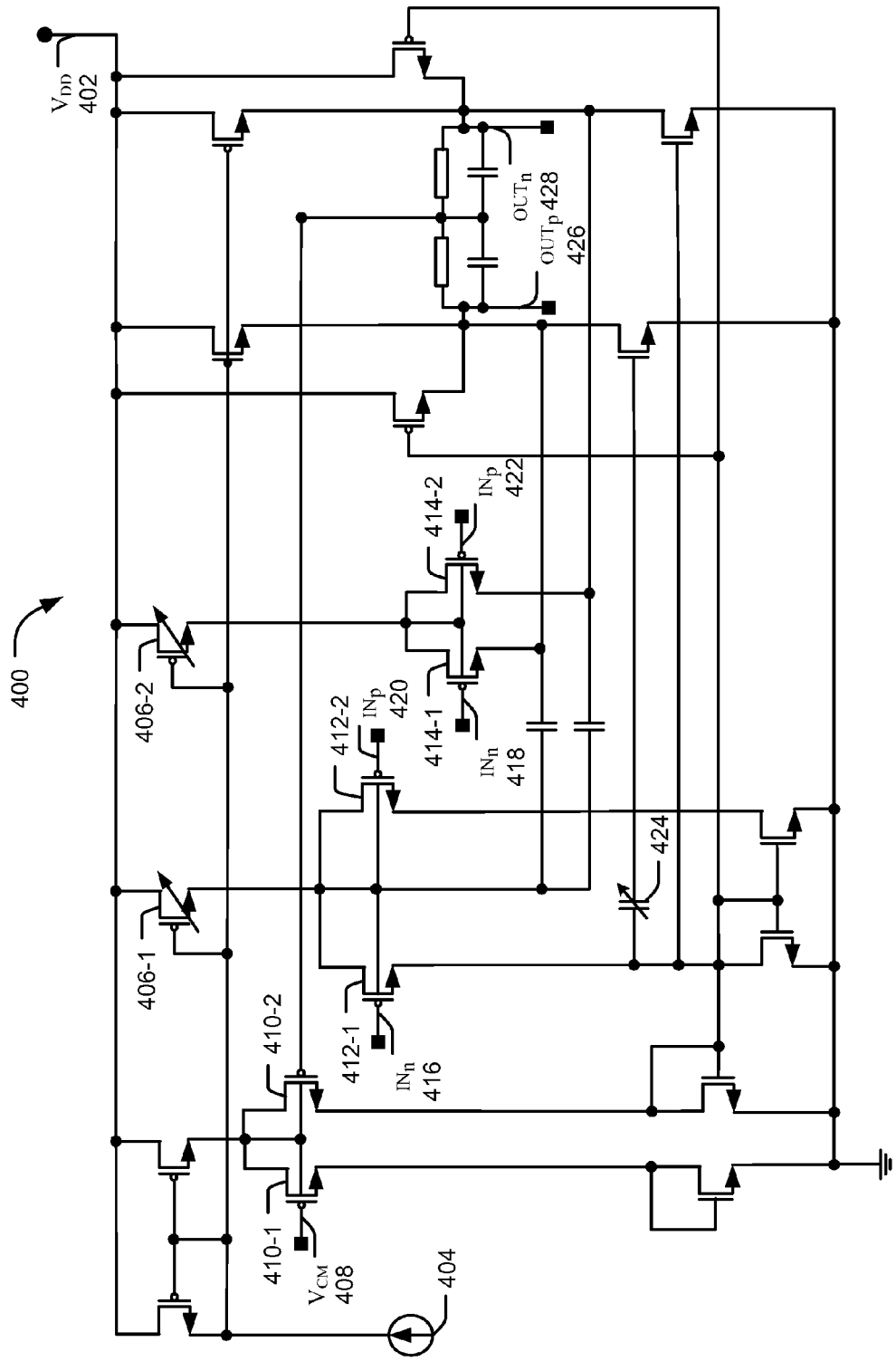
FIG. 4A is a diagram illustrating an exemplary circuit diagram of a programmable conditionally stable operational amplifier.

FIG. 4A illustrates a circuit diagram 400 of an exemplary programmable conditionally stable operational amplifier. The circuit diagram is intended to assist in understanding the concept of a programmable compensation network for a multimode conditionally stable amplifier component 112 at an elementary level. The number and type of electronic components depicted in the circuit diagram 400 does not limit the realization of the programmable compensation network for the conditionally stable operational amplifiers. In the following description, the components common to FIGS. 1 to 3 have been referred to using the same names and/or numerals.

Figure 4B:
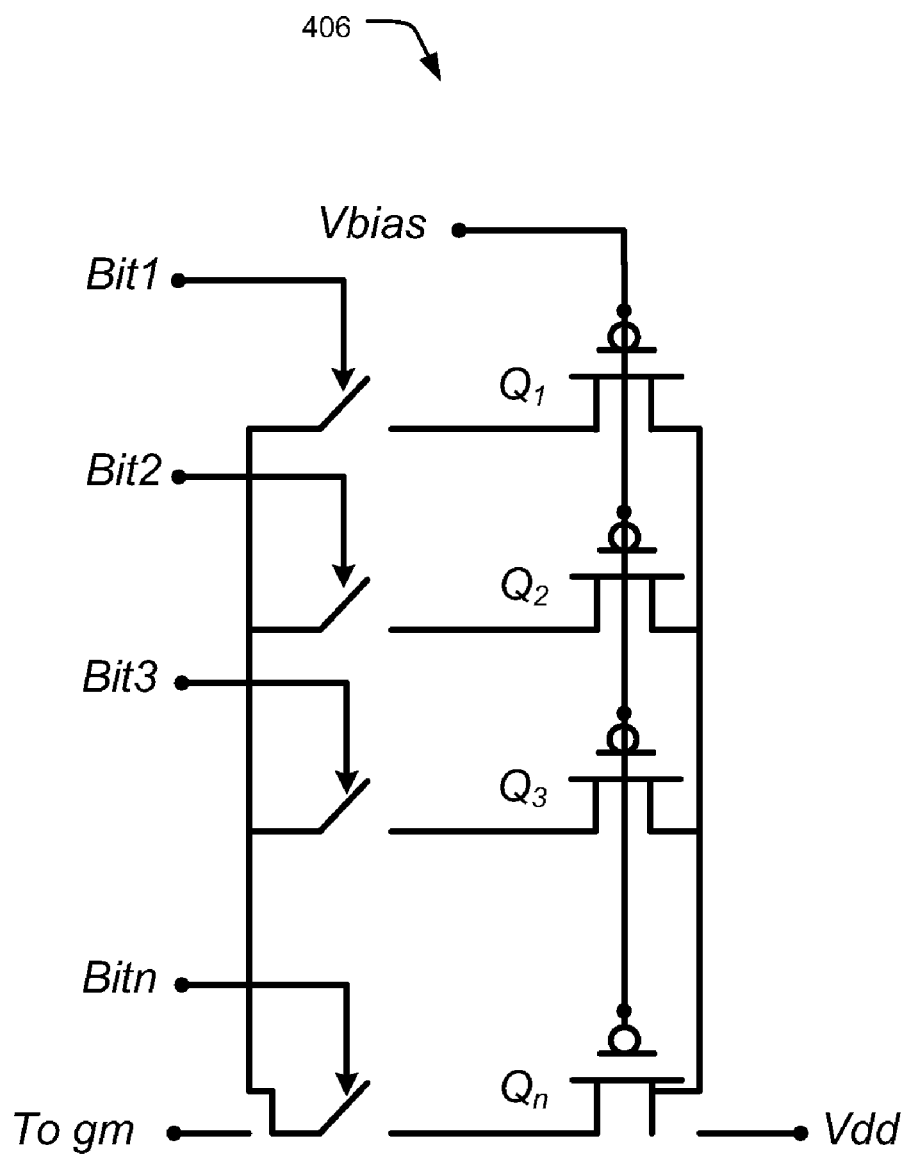
FIG. 4B is a diagram illustrating an exemplary programmable transistor.

The circuit 400 includes a supply voltage $V_{DD}$ 402 and a current source 404. The current source 404 provides the necessary bias current to the varying p-channel MOSFETs 406-1 and 406-2. Referring now to FIG. 4B, illustrated is an example of a varying programmable p-channel MOSFET 406 (i.e., a programmable transistor).

Referring back to FIG. 4A, in addition, the circuit 400 includes trans-conductors that are implemented via a differential amplifier realized with p-channel MOSFETs, or pMOS. In an implementation, any other type of transistors, such as BJTs, can also be used in place of the p-channel MOSFETs. A common-mode voltage $V_{CM}$ 408 is applied to the differential amplifier realized with pMOS 410-1 and pMOS 410-2.

The circuit 400 includes a trans-conductor implemented via a differential amplifier realized with the help of pMOS 412-1 and pMOS 412-2, referred collectively as trans-conductor 412 (e.g., programmable OTA component 202 in FIG. 2). Furthermore, the circuit 400 includes a trans-conductor implemented via a differential amplifier realized with pMOS 414-1 and pMOS 414-2, collectively referred to as trans-conductor 414 (e.g., programmable OTA component 200 in FIG. 2). The input signal with negative polarity $IN_n$ 416 and 418 is applied at the gate of the pMOS 412-1 and the pMOS 414-1, respectively, while the input signal carrying positive polarity $IN_p$ 420 and 422 is applied at the gate of the pMOS 412-2 and the pMOS 414-2, respectively.

In operation, increasing the number of pMOS transistors connected in parallel in the varying pMOS 406-1, the bias current in the corresponding trans-conductor 412 (e.g., programmable OTA component 202 in FIG. 2) also increases, thereby increasing the corresponding trans-conductance. Accordingly, the trans-conductance of the trans-conductor 412 is set to a desired value.

In order to achieve stability for the circuit 400 for the desired value of trans-conductance of the trans-conductor 412 (e.g., programmable OTA component 202 in FIG. 2), the affecting parameters such as trans-conductance of the trans-conductor 414 (e.g., programmable OTA component 200 in FIG. 2) and capacitance of a capacitor 424 (e.g., programmable capacitor component 204 in FIG. 2), are varied for reasons as stated as to equation (1). Bias current in the varying pMOS 406-2 is adjusted accordingly, to produce an appropriate trans-conductance across the corresponding trans-conductor 414 (e.g., programmable OTA component 200 in FIG. 2) for providing stability to the operational amplifier component 112.

Thus, the programmability of the trans-conductance of the first stage and the feed-forward stage of the operational amplifier component 112 is achieved by tuning the respective bias currents in the pMOS 406-1 and 406-2. The varying pMOS 406-1 and pMOS 406-2 may be realized by means of switchable pMOS transistors connected in parallel, that are switched ON or OFF. The varying capacitor 424 (e.g., programmable capacitor component 204 in FIG. 2) may include a bank of switchable capacitors that are switched ON or OFF. The programmability of the switchable pMOS transistors and capacitors allow the ability to compensate for various parameters such as phase margin, frequency, etc., for a set condition such as closed loop gain, closed loop frequency response, etc. An output is provided at the output terminals $OUT_p$ 426 and $OUT_n$ 428.

Exemplary Method

Figure 5:
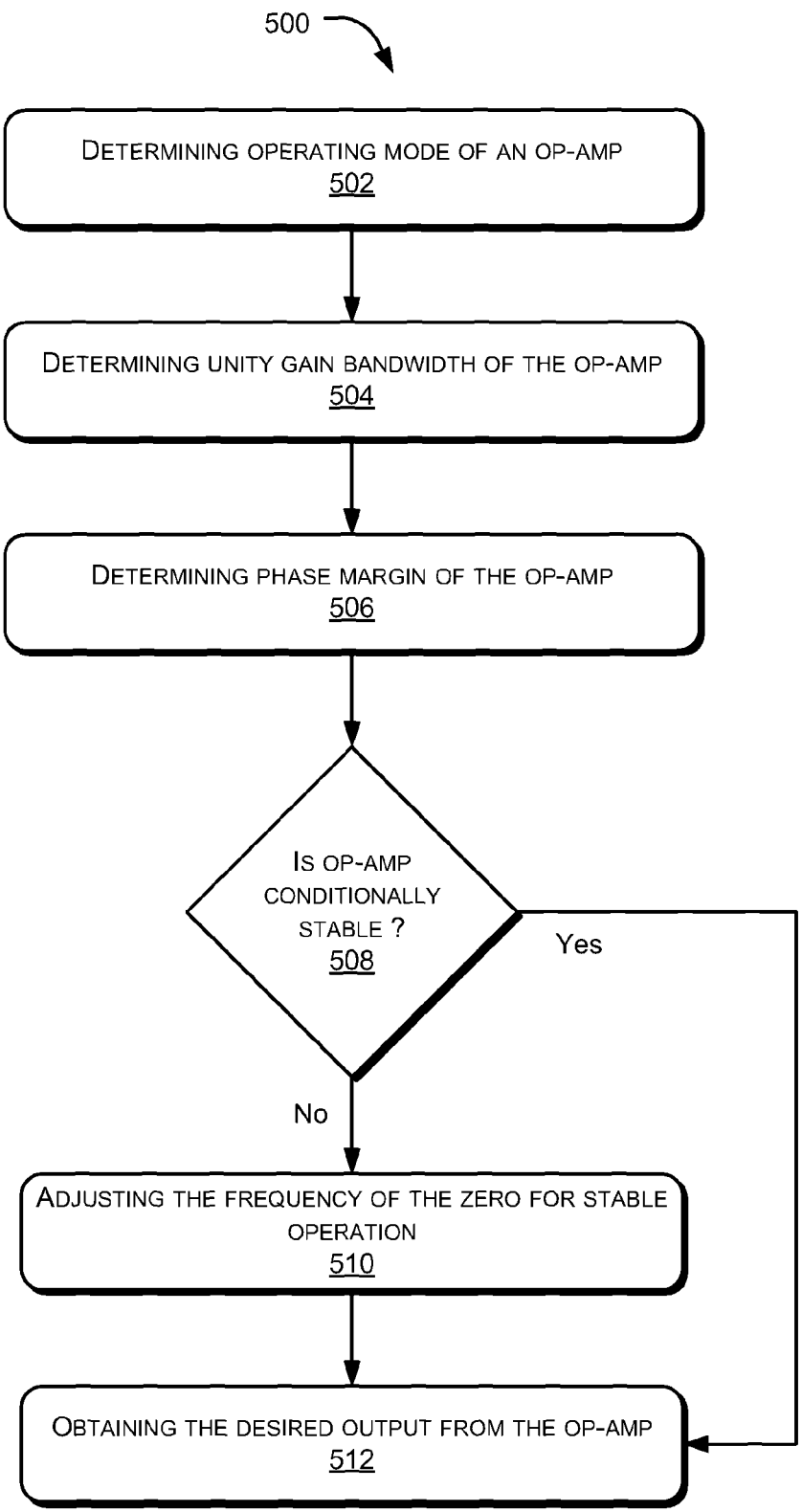
FIG. 5 is a flowchart illustrating an exemplary method for implementing a programmable compensation network in a conditionally stable operational amplifier.

FIG. 5 illustrates an exemplary method 500 for implementing a programmable compensation network in a conditionally stable operational amplifier. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 502, determining an operative mode for a conditionally stable operational amplifier, such as the operational amplifier component 112, is performed. In an implementation, the operational amplifier component 112 can be operated in different operating modes, for example as a unity gain buffer, a high bandwidth integrator, a low power integrator, and so on.

At block 504, determining open loop unity gain bandwidth of the operational amplifier is performed. Based on the selected operative mode, the open loop unity gain bandwidth of the operational amplifier may differ. For example, for the operational amplifier component 112 to be stable in the selected operative mode, various parameters, such as the frequency of the zero $Z_{ff}$ 308 of the open-loop transfer function may be adjusted, by means of adjusting the transconductance $gm_{ff}$ 200, and/or the trans-conductance $gm_1$ 202, and/or the varying capacitor 424 (e.g., programmable capacitor component 204 in FIG. 2), as described in equation (1). The frequency of the zero $Z_{ff}$ 308 may be reduced such that the unity gain frequency $U_f$ 310 is sufficiently high.

At block 506, setting the phase-margin of the operational amplifier to a desired value is performed. In an implementation, the phase margin of the operational amplifier component 112 may be set by varying the transconductance $gm_{ff}$ 200, and/or the trans-conductance $gm_1$ 202, and/or the varying capacitor 424 (e.g., programmable capacitor component 204 in FIG. 2). Therefore, by varying the frequency of the zero $Z_{ff}$ 308, the open loop unity gain bandwidth is adjusted, and the stability of the operational amplifier component 112 for different conditions is maintained.

At block 508, determining whether the operational amplifier component is conditionally stable at the set operating condition is performed. In an implementation, a condition for the conditionally stable operational amplifier is set by varying the frequency of the zero $Z_{ff}$ to a desired value as discussed.

If the operational amplifier is not conditionally stable, the method 500 proceeds to block 510 (i.e., the "no" branch of block 508). Otherwise, if the operational amplifier is conditionally stable, the method 500 proceeds to block 512 (i.e., the "yes" branch of block 508).

At block 510, adjusting the frequency of the zero $Z_{ff}$ 308 is performed at a suitable value lower than the unity gain frequency $U_f$ 310 for maintaining stability of the conditionally stable operational amplifier component 112. When the conditionally stable operational amplifier component 112, set to different conditions, is not stable then the corresponding parameters that have a direct influence on the location of zero $Z_{ff}$ 308 and thereby on the stability are varied to obtain a stable output. The different conditions could account for different system requirements such as different closed loop gains, and/or different closed loop frequency responses, etc. In an implementation, the parameters including the transconductance $gm_{ff}$ 200, and/or the trans-conductance $gm_1$ 202, and/or the varying capacitor 424 (e.g., programmable capacitor component 204 in FIG. 2) of the programmable OTA component 200, are correspondingly varied to set the frequency of the zero $Z_{ff}$ 308 to an appropriate location on the Bode plot 300.

At block 512, obtaining a desired output from the operational amplifier is performed. This corresponds to receiving the desired stable output from the conditionally stable operational amplifier at the set conditions.

CONCLUSION

Although embodiments for a programmable compensation network for conditionally stable operational amplifier have been described in language specific to structural features and/or methods, it is to be understood that the appended claims are not necessarily limited to the specific features or methods described. Rather, the specific features and methods are disclosed as exemplary implementations for the programmable compensation network.

What is claimed is:

1. A circuit comprising:
a passive high pass filter configured to pass a high frequency component of an input voltage; and
a conditionally stable operational amplifier component comprising a programmable feed-forward operational trans-conductance amplifier (OTA) component and an operational trans-conductance amplifier component, the conditionally stable operational amplifier component configured to amplify the high frequency component of the input voltage.

2. The circuit of claim 1, wherein the conditionally stable operational amplifier component includes an internal compensation network that can be adjusted to various gain configurations.

3. The circuit of claim 2, wherein the internal compensation network of the conditionally stable operational component is programmable.

4. The circuit of claim 1, wherein the conditionally stable operational amplifier component is stable for different gain values.

5. The circuit of claim 1, wherein the programmable feed-forward OTA component includes a programmable adjustment to produce a varying output signal to attain a desired phase margin corresponding to a particular application functionality.

6. The circuit of claim 1 further comprising a programmable capacitor component used as a parameter to program the conditionally stable operational amplifier component.

7. A programmable compensation network comprising:
a conditionally stable operational amplifier comprising:
a first stage that includes a feed-forward compensation scheme, wherein the first stage implements a programmable operational trans-conductance amplifier; and
a second stage connected to the first stage, the second stage including an operational trans-conductance amplifier.

8. The programmable compensation network of claim 7, wherein the first stage includes a programmable capacitor.

9. The programmable compensation network of claim 7, wherein the first stage amplifies an input signal received by the programmable compensation network.

10. The programmable compensation network of claim 9, wherein an output of the first stage is amplified by the second stage.

11. The programmable compensation network of claim 9, wherein a desired trans-conductance value selected by the first stage provides stability to the programmable compensation network.

12. The programmable compensation network of claim 11, wherein the stability is based on one or more of the parameters of frequency and phase margin.

13. The programmable compensation network of claim 7, wherein trans-conductance is varied in the feed forward compensation scheme, and capacitance is adjusted in the first stage.

14. A method for implementing compensation in an operational amplifier, the method comprising:
determining an operative mode for the operational amplifier;
determining open loop unity gain bandwidth of the operational amplifier, the determination based on a selected operative mode;
setting a gain value of the operational amplifier;
determining if the operational amplifier is stable at a predetermined operating condition; and
compensating voltage by adjusting parameters of the operational amplifier to obtain stability at the operational amplifier.

15. The method of claim 14, wherein the selected operative mode includes one of the following operative modes: unity gain buffer, high bandwidth integrator or low power integrator.

16. The method of claim 14, wherein the determining open loop unity gain bandwidth is based on a unity gain bandwidth frequency to maintain stability of the operational amplifier.

17. The method of claim 14, wherein the setting is performed by varying trans-conductance of a first stage of the operational amplifier.

18. The method of claim 14, wherein the compensating voltage by adjusting parameters is based on adjusting zeros of an open loop function affecting the operational amplifier.

* * * * *